US009953745B2

(12) United States Patent
Ohgushi et al.

(10) Patent No.: US 9,953,745 B2
(45) Date of Patent: Apr. 24, 2018

(54) SHIELDED WIRE AND WIRE HARNESS

(71) Applicant: Yazaki Corporation, Tokyo (JP)

(72) Inventors: Kazuhiro Ohgushi, Susono (JP); Satoru Yoshinaga, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/695,168

(22) Filed: Sep. 5, 2017

(65) Prior Publication Data

US 2018/0068763 A1 Mar. 8, 2018

(30) Foreign Application Priority Data

Sep. 7, 2016 (JP) ................................ 2016-174243

(51) Int. Cl.

*H01B 7/18* (2006.01)
*H01B 11/06* (2006.01)
*H01B 7/00* (2006.01)
*H05K 9/00* (2006.01)
*H01B 7/02* (2006.01)

(52) U.S. Cl.

CPC ............ *H01B 7/18* (2013.01); *H01B 7/0045* (2013.01); *H01B 7/0216* (2013.01)

(58) Field of Classification Search

CPC ....... H01B 7/18; H01B 7/0216; H01B 7/0045
USPC ..................... 174/34, 72 A, 102 C, 107, 350
See application file for complete search history.

(56) References Cited

U.S. PATENT DOCUMENTS 4,970,352 A * 11/1990 Satoh .................. G01R 31/021 174/102 C
2009/0126993 A1 * 5/2009 Nishimura .............. H01B 3/28 174/72 A
2011/0036613 A1 * 2/2011 Hayashishita ..... H01B 13/0165 174/105 R
2015/0083458 A1 * 3/2015 Tanaka ..................... H01B 7/04 174/107

FOREIGN PATENT DOCUMENTS

JP 2013-110053 A 6/2013

* cited by examiner

*Primary Examiner* — Sherman Ng
(74) *Attorney, Agent, or Firm* — Sughrue Mion, PLLC

(57) ABSTRACT

A shielded wire includes an electrical wire including a conductor portion and a covering portion, a shield braid in which electrically conductive wire members are braided, and which covers an outer circumference of the electrical wire, a tubular sheath disposed on an outer circumference of the shield braid and made of an insulating resin.

2 Claims, 9 Drawing Sheets

SHIELDED WIRE AND WIRE HARNESS

CROSS REFERENCE TO RELATED APPLICATIONS

This application claims priority from Japanese Patent Application No. 2016-174243 filed on Sep. 7, 2016, the entire contents of which are incorporated herein by reference.

BACKGROUND OF THE INVENTION

Field of the Invention

The present invention relates to a shielded wire and a wire harness.

Description of Related Art

Conventionally, a shield braid configured by braiding metal coated fibers in each of which a metal film is formed on the outer circumference of a refractory fiber, copper members made of copper or a copper alloy being placed between a plurality of metal coated fibers constituting the braid, at a constant thickness has been proposed (see Patent Literature 1: JP-A-2013-110053). According to the shield braid, while high bendability is realized by the metal coated fibers, the grounding process is enabled by the copper members to be easily performed, and, when the thickness of the copper members is made adequate, the bendability can be prevented from being lowered by an excessive thickness of the copper members.

[Patent Literature 1] JP-A-2013-110053

According to a related art, in a shield braid, no consideration is given to a sheath which is disposed on an outer circumference of the shield braid, and, even when the shield braid itself has a high bendability, there is a possibility that the bendability may be lowered by the influence of the sheath. In the case where the shield braid is bent, for example, the degree of freedom is lost because of the contractile force of the sheath, and therefore there is a possibility that the wires may be broken at an early stage. In such a case, the shielding performance is lowered, and the bending resistance of the whole of the shielded wire including the sheath cannot be improved.

One or more embodiments provide a shielded wire and a wire harness in which bending resistance can be improved.

In accordance with one or more embodiments, a shielded wire includes an electrical wire including a conductor portion and a covering portion, a shield braid in which electrically conductive wire members are braided, and which covers an outer circumference of the electrical wire, and a tubular sheath disposed on an outer circumference of the shield braid and made of an insulating resin, wherein D1 is an inner diameter of the sheath in a state where the sheath is disposed on the outer circumference of the shield braid, wherein t is a thickness of the sheath in the state where the sheath is disposed on the outer circumference of the shield braid, wherein E is a modulus of elasticity of the sheath, wherein $\mu_A$ is a coefficient of static friction between the shield braid and the electrical wire, wherein $\mu_B$ is a coefficient of static friction between the shield braid and the sheath, wherein $F_{max}$ is a value of a load which, in a fatigue test where a load is repeatedly applied to the shield braid in an axial direction of the braid, is obtained when an electrical resistance value of the shield braid is increased by 10% with respect to an initial value at a timing when the load is repeatedly applied 5 million times, wherein D2 is an inner diameter of the sheath in a free state, and wherein D2 satisfies following relational expression (1).

$$D1-\frac{D1^2F_{max}\times 10^4}{\pi tE(\mu_A+\mu_B)}\leqq D2<D1 \tag{1}$$

According to one or more embodiments, the inner diameter D2 of the sheath in the free state satisfies the above-described relational expression, and therefore it is possible to reduce the possibility that the constriction of the shield braid is excessively enhanced by contraction of the sheath, and the electrically conductive wire member is broken before 5 million endurance cycles. Therefore, the bending resistance of the whole shielded wire can be improved.

In the wire harness of one or more embodiments, the wire harness may include the above mentioned shielded wire.

The wire harness includes the shielded wire in which the bending resistance is improved, and therefore also the bending resistance of the whole wire harness can be improved.

According to one or more embodiments, it is possible to provide a shielded wire and wire harness in which the bending resistance can be improved.

DETAILED DESCRIPTION

Exemplary embodiments are described with reference to the drawings. This invention is not limited to the below-described embodiment. The embodiment can be adequately changed without departing from the spirit of the invention. Although, in the below-described embodiment, illustrations and descriptions of partial configurations are omitted, it is matter of course that, with respect to the details of the omitted techniques, known or well-known techniques are applied within the range where no inconsistency occurs with the contents of the following description.

Figure 1:
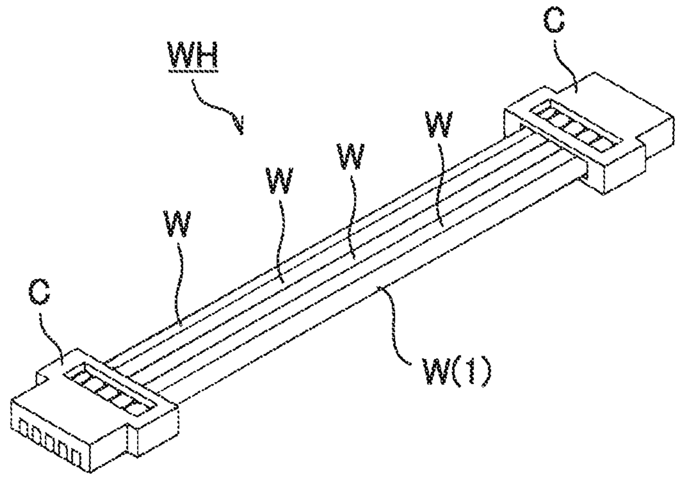
FIG. 1 is a perspective view showing a wire harness including shielded wires of an embodiment of the invention.

FIG. 1 is a perspective view showing a wire harness including shielded wires of the embodiment of the invention. As shown in FIG. 1, the wire harness WH is configured by bundling a plurality of electrical wires W. At least one (one circuit) of the plurality of wires W is a shielded wire 1 which will be described later in detail. For example, the wire harness WH may include connecters C in the both ends of the wires W as shown in FIG. 1, or may be wrapped with a tape (not shown) in order to bundle the wires W. The wire harness WH may include an armoring component (not shown) such as a corrugated tube, or each of the wires W may include a branch portion.

Figure 2:
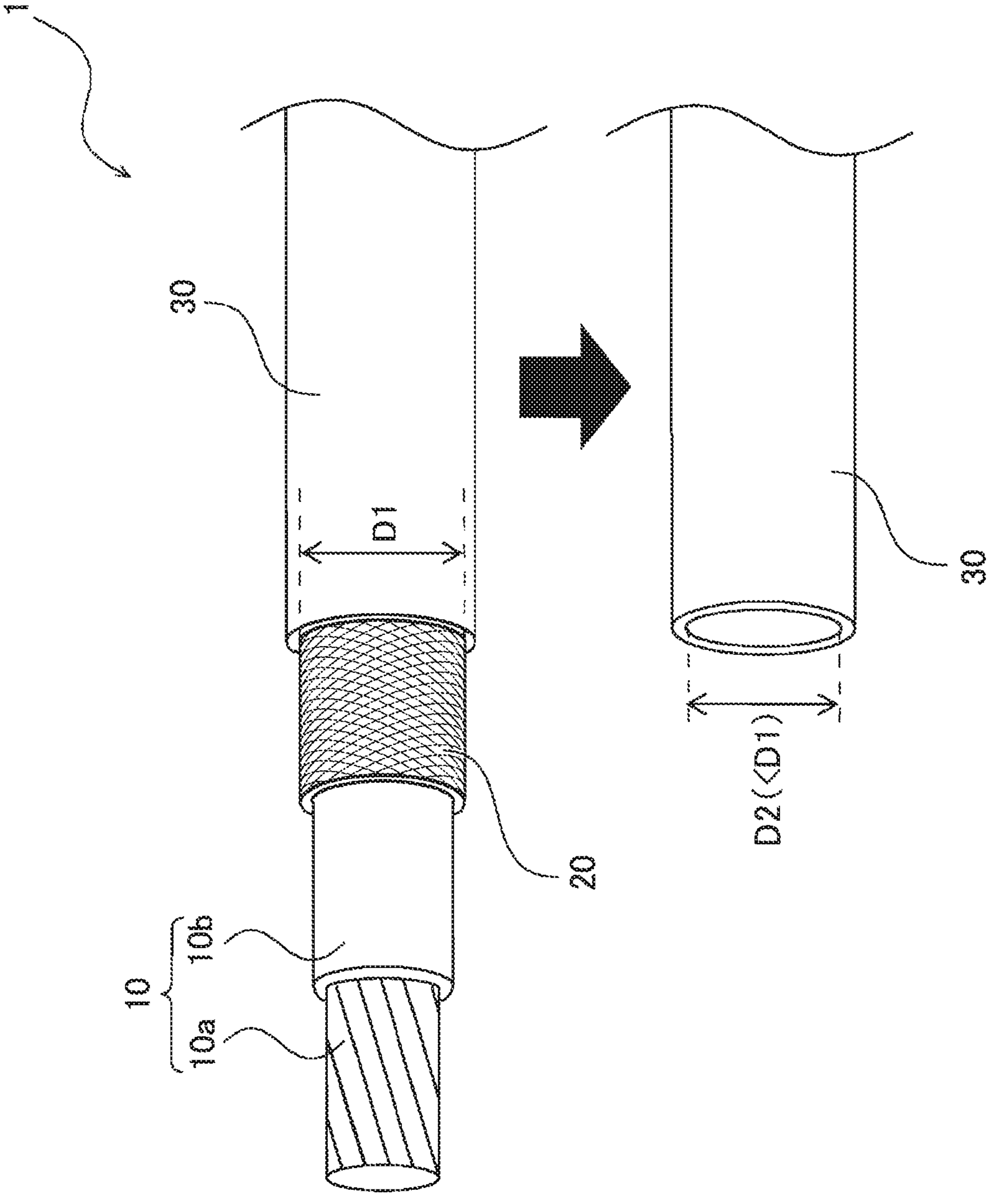
FIG. 2 is a perspective view showing the shielded wire shown in FIG. 1.

FIG. 2 is a perspective view showing the shielded wire 1 shown in FIG. 1. In FIG. 2, in addition to the shielded wire 1, also a partial configuration in the free state where the sheath is disposed on the outer circumference of the shield braid is additionally illustrated. The shielded wire 1 shown in FIG. 2 includes an electrical wire 10, shield braid 20, and a sheath 30. The electrical wire 10 is configured by a conductor portion 10*a* and a covering portion 10*b*. In the embodiment, the conductor portion 10*a* is formed by a twisted wire in which a plurality of metal strands made of copper, aluminum, an alloy of these metals, or the like are twisted. The nominal sectional area of the conductor portion 10*a* is, for example, 8 sq. mm or more.

Each of the metal strands has a diameter of 0.05 mm to 0.12 mm. Since the strand diameter is 0.05 mm or larger, the strands are not excessively thin, and the possibility that the wire is broken as a result of repeated bending can be reduced. Since the strand diameter is 0.12 mm or smaller, moreover, the flexibility can be ensured (distortion due to bending can be reduced), and the possibility that the wire is broken as a result of repeated bending can be reduced. That is, also the above-described range of the diameter of each of the metal strands enables the electrical wire 10 to have a structure of high bendability.

The shield braid 20 is configured by knitting 48 plated fiber bundles (an example of the electrically conductive wire member) in which metal plating is performed on tensile strength fibers, and covers the outer circumference of the electrical wire 10. Here, the tensile strength fibers are fibers in which the fibrous material is produced by chemical synthesis from raw materials such as petroleum, the tensile strength at break is 1 GPa or higher, and the elongation rate at break is 1% or larger and 10% or smaller. Examples of such fibers are aramid fibers, polyarylate fibers, and PBO fibers. The metal plating is configured by a metal such as copper or tin.

Specifically, for example, the tensile strength fibers are polyarylate fibers (φ is 0.022 mm, and the number of filaments is 300), and the metal plating is configured by stacking copper and tin layers in this sequence starting from the lower layer, and has a thickness of 2.4 μm, on each fiber.

The sheath 30 is a tubular member made of an insulating resin which is disposed on the outer circumference of the shield braid 20, and has a certain degree of stretchability. The sheath 30 is configured by polyethylene, ethylene-propylene rubber (hereinafter referred to as EPDM rubber), or the like. In the state (the inner diameter is D1) where the sheath is disposed on the outer circumference of the shield braid 20, the inner diameter is increased as compared with that in the free state (the inner diameter is D2 (D2<D1)). That is, the sheath 30 is caused by the own contractile force to be in close contact with the shield braid 20.

In the embodiment, here, the inner diameter D2 of the sheath 30 in the free state satisfies following Relational expression (1):

$$D1 - \frac{D1^2 F_{max} \times 10^4}{\pi t E(\mu_A + \mu_B)} \leqq D2 < D1 \tag{1}$$

In the above expression, D1 is the inner diameter of the sheath 30 in the state where the sheath is disposed on the outer circumference of the shield braid 20, t is the thickness of the sheath 30 in the state where the sheath is disposed on the outer circumference of the shield braid 20, E is the modulus of elasticity of the sheath 30, $\mu_A$ is the coefficient of static friction between the shield braid 20 and the electrical wire 10, and $\mu_B$ is the coefficient of static friction between the shield braid 20 and the sheath 30. Moreover, $F_{max}$ is a value of a constant load which, in a fatigue test where a load is repeatedly applied to the shield braid 20 in the axial direction of the braid, is obtained when the resistance of the shield braid 20 is increased by 10% with respect to the initial value at timing when the load is repeatedly applied 5 million times.

When the inner diameter D2 of the sheath 30 in the free state is set to have a value in the range which is obtained from the above expression, it is possible to reduce the possibility that the constriction of the shield braid 20 is excessively enhanced by contraction of the sheath 30, and the plated fibers are broken before 5 million endurance cycles, and therefore the bending resistance of the whole shielded wire 1 can be improved. Hereinafter, this will be described in detail.

Figure 3:
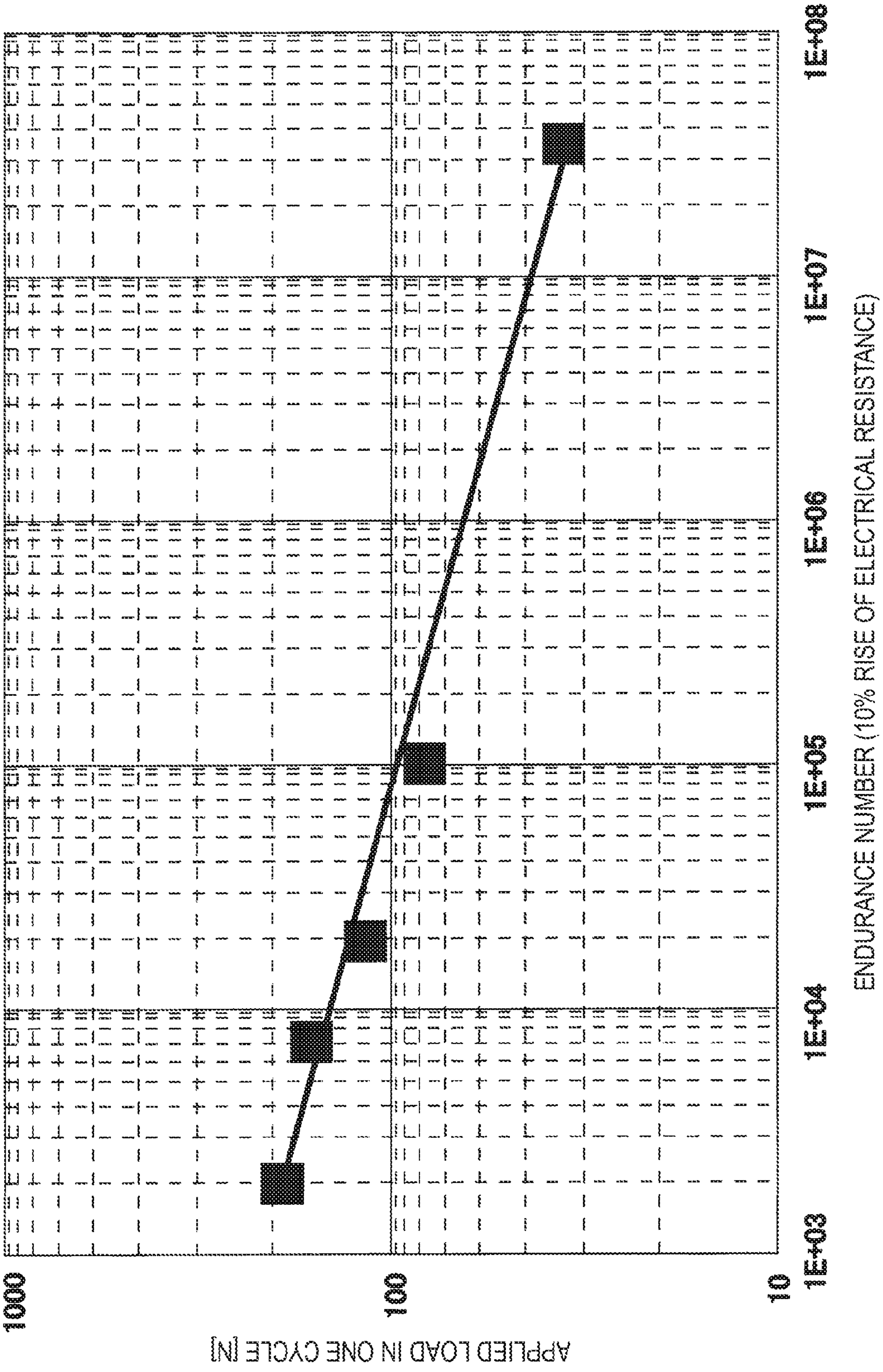
FIG. 3 is a graph showing results of fatigue tests of a plated fiber bundle constituting a shield braid.

FIG. 3 is a graph showing results of fatigue tests of a plated fiber bundle constituting the shield braid 20. In the plated fiber bundle used in the example of FIG. 3, the tensile strength fibers are polyarylate fibers (φ is 0.022 mm, and the number of filaments is 300), and the metal plating is configured by stacking copper and tin layers in this sequence starting from the lower layer, on each fiber, and has a thickness of 2.4 μm.

In the fatigue test, firstly, a constant load F was repeatedly applied until the resistance of the plated fiber bundle was increased by 10% with respect to the initial value. Namely, a cycle in which the constant load F is applied and then the load is reduced to 0 N was repeatedly performed. The applied load can be expressed as a sinusoidal wave, and the test was performed at a frequency of 10 Hz.

As shown in FIG. 3, in the case where the applied constant load F was about 110 N, when the load was repeatedly applied about 2,000 times, the resistance of the plated fiber bundle was increased by 10% with respect to the initial value. In the case where the applied constant load F was about 107 N, when the load was repeatedly applied about 7,000 times, the resistance of the plated fiber bundle was increased by 10% with respect to the initial value.

Moreover, in the case where the applied constant load F was about 103 N, when the load was repeatedly applied about 20,000 times, the resistance of the plated fiber bundle was increased by 10% with respect to the initial value, and, in the case where the applied constant load F was about 70 N, when the load was repeatedly applied about 100,000 times, the resistance of the plated fiber bundle was increased by 10% with respect to the initial value. In the case where the applied constant load F was 35 N, when the load was repeatedly applied thirty-five million times, the resistance of the plated fiber bundle was increased by 10% with respect to the initial value. When the above measurement results are linearly approximated, it is possible to express the relationship of the applied constant load and the number of cycles which were performed until the resistance was increased by 10% with respect to the initial value.

In the plated fiber bundle used in the example of FIG. 3, therefore, it can be said that the maximum value $F_{max}$ of the constant load F which can be applied in order to realize a bending resistance of 5 million times or more is 45 N.

Figure 4:
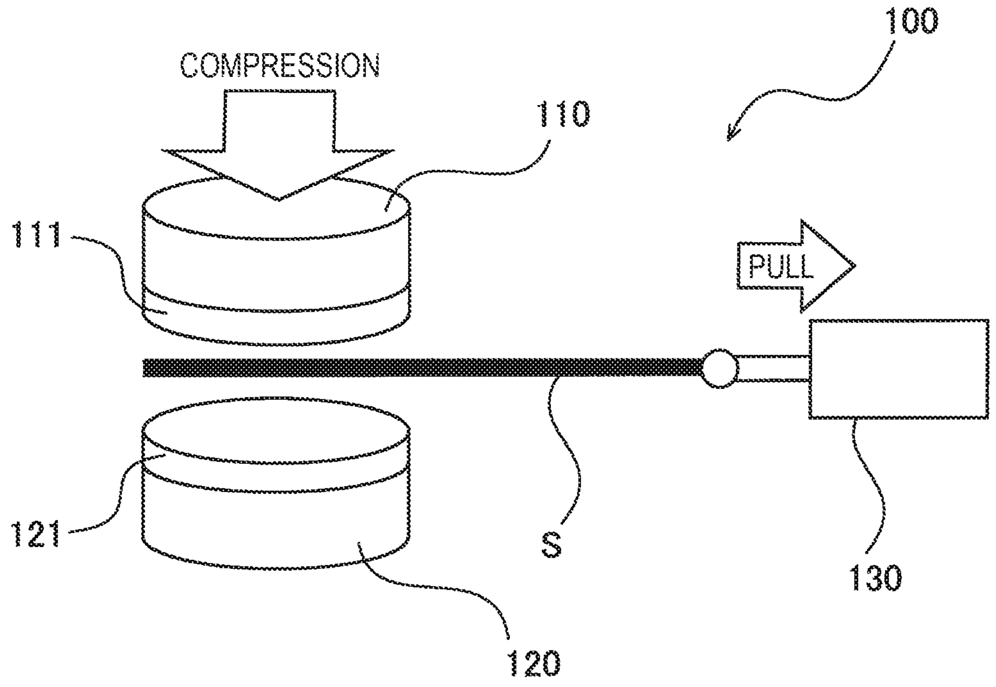
FIG. 4 is a configuration diagram showing a measurement apparatus for measuring a static friction force which is necessary for moving a plated fiber bundle.

FIG. 4 is a configuration diagram showing a measurement apparatus for measuring a static friction force which is necessary for moving a plated fiber bundle. The plated fiber bundle S shown in FIG. 4 is the plated fiber bundle which constitutes the above-described shield braid 20 that was used in the fatigue test of FIG. 3, and in which the number of filaments is 300.

As shown in FIG. 4, the measurement apparatus 100 is configured by a first compression member 110, a second compression member 120, and a pulling mechanism 130. The first and second compression members 110, 120 are columnar members (φ is 20 mm) between which the plated fiber bundle S is to be clamped, respectively. Compression materials 111, 121 are disposed on the sides where the compression members are in contact with the plated fiber bundle S, respectively. In a state where the plated fiber bundle S is placed on, for example, the compression material 121 of the second compression member 120, a predetermined compression force is applied to the plated fiber bundle from the upper side by the first compression member 110, thereby producing a state where the plated fiber bundle is clamped between the compression materials 111, 121.

The pulling mechanism 130 pulls one end of the plated fiber bundle S. The pulling mechanism 130 gradually increases the tensile load, and measures the force (static friction force) at a timing when the plated fiber bundle S is moved.

Figure 5:
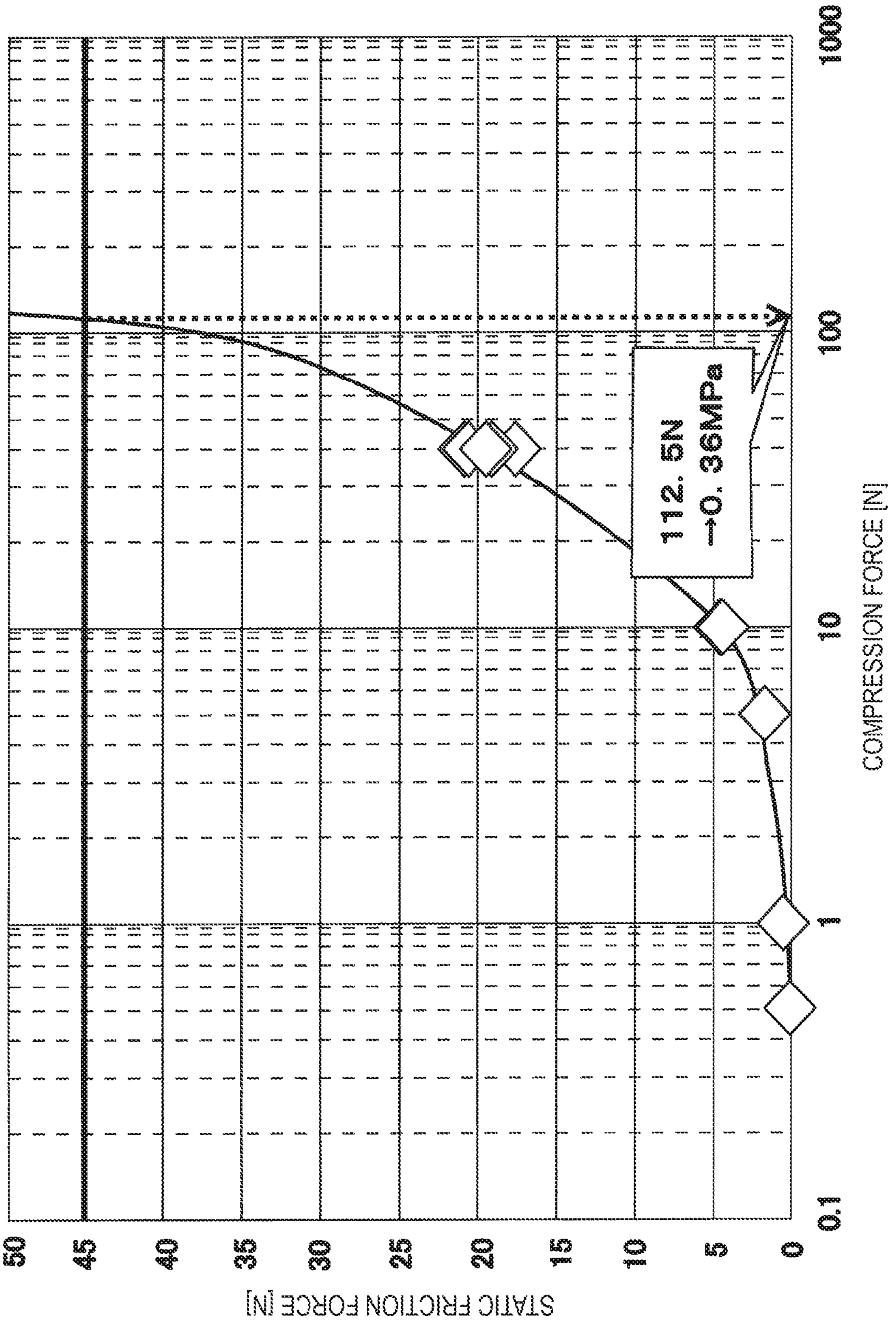
FIG. 5 is a graph showing a static friction force in the case where both compression materials shown in FIG. 4 are made of polyethylene (the coefficient of static friction is 0.4).

FIG. 5 is a graph showing a static friction force in the case where both the compression materials 111, 121 shown in FIG. 4 are made of polyethylene (the coefficient of static friction is 0.4). As shown in FIG. 5, in the cases where compression forces of 0.5 N, 1 N, 5 N, 10 N, and 50 N were applied to the first compression member 110, the static friction forces were about 0.1 N, about 0.2 N, about 2 N, about 10 N, and about 18 N, respectively. It was confirmed that the static friction force can be approximated by a relational expression (the solid line in FIG. 5) of the friction force and the normal reaction force while the static friction coefficient (=0.4) between the plated fiber bundle S and polyethylene is set as the proportional constant.

As described with reference to FIG. 3, when the load F is 45 N which is the maximum value $F_{max}$ for realizing a bending resistance of 5 million times or more, therefore, the compression force is 112.5 N, and the pressure is 0.36 MPa.

In the shielded wire 1 in which the same shield braid 20 as in the example of FIG. 3 is employed, and polyethylene is used in both the covering portion 10*b* of the electrical wire 10, and the sheath 30, when the pressure which is applied to the side of the shield braid 20 by the contraction of the sheath 30 (hereinafter, the pressure is referred to as the sheath internal pressure) exceeds 0.36 MPa, a bending resistance of 5 million times or more cannot be realized.

Figure 6:
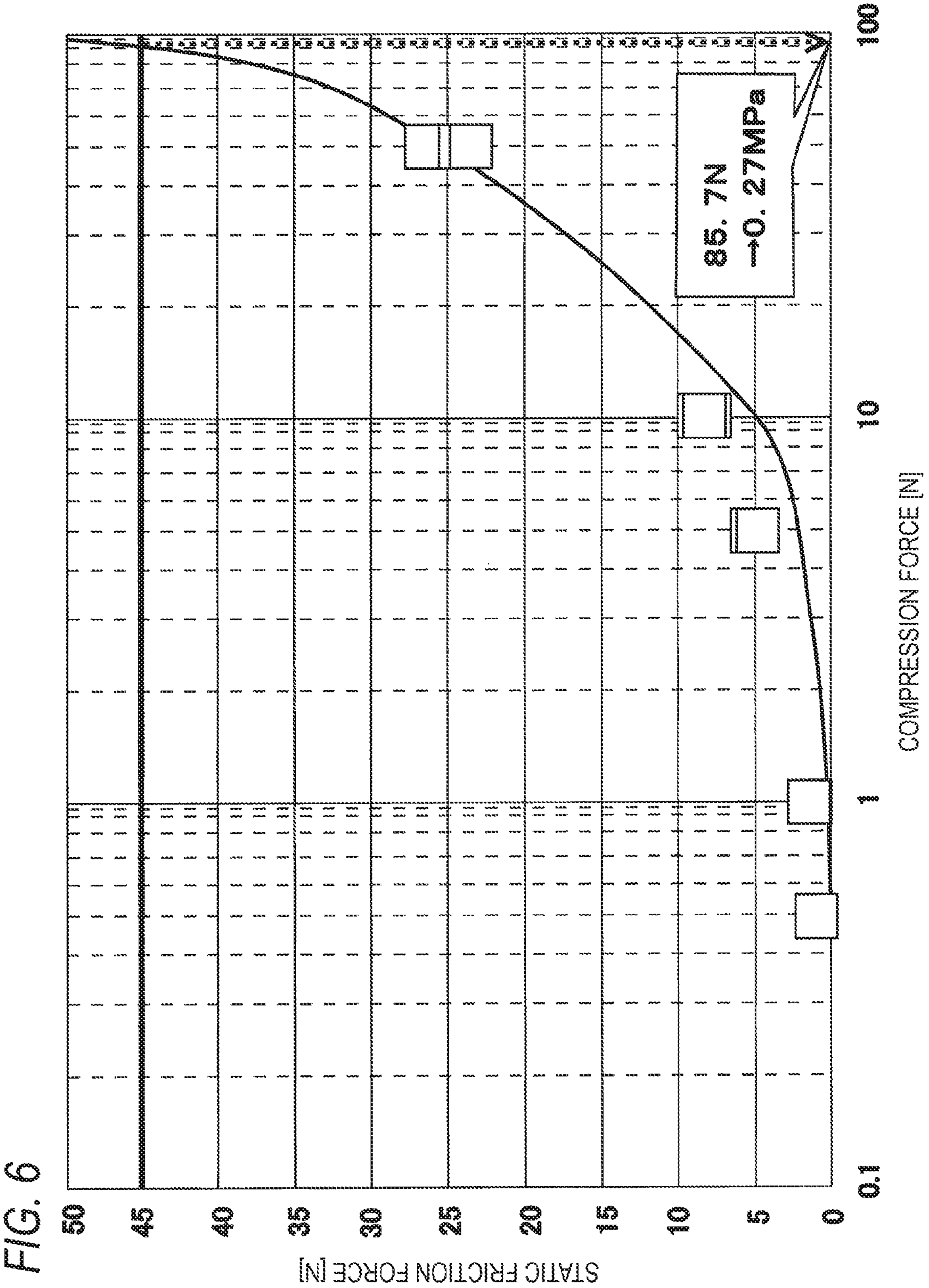
FIG. 6 is a graph showing a static friction force in the case where one of the compression materials shown in FIG. 4 is made of EPDM rubber (the coefficient of static friction is 0.65), and the other compression material is made of polyethylene (the coefficient of static friction is 0.4).

FIG. 6 is a graph showing a static friction force in the case where the compression material 111 shown in FIG. 4 is made of EPDM rubber (the coefficient of static friction is 0.65), and the compression material 121 is made of polyethylene (the coefficient of static friction is 0.4). As shown in FIG. 6, in the cases where compression forces of 0.5 N, 1 N, 5 N, 10 N, and 50 N were applied to the first compression member 110, the static friction forces were about 0.5 N, about 1 N, about 5 N, about 7 N, and about 25 N, respectively. It was confirmed that the static friction force can be approximated by a relational expression (the solid line in FIG. 6) of the friction force and the normal reaction force while the average value (=0.525) of the static friction coefficient (=0.65) between the plated fiber bundle S and EPDM rubber, and the static friction coefficient (=0.4) between the plated fiber bundle S and polyethylene is set as the proportional constant.

As described with reference to FIG. 3, when the load F is 45 N which is the maximum value $F_{max}$ for realizing a bending resistance of 5 million times or more, therefore, the compression force is 85.7 and the pressure is 0.27 MPa.

In the shielded wire 1 in which the same shield braid 20 as in the example of FIG. 3 is employed, and EPDM rubber is used in one of the covering portion 10*b* of the electrical wire 10, and the sheath 30, and polyethylene is used in the other of them, when the sheath internal pressure exceeds 0.27 MPa, a bending resistance of 5 million times or more cannot be realized.

Figure 7:
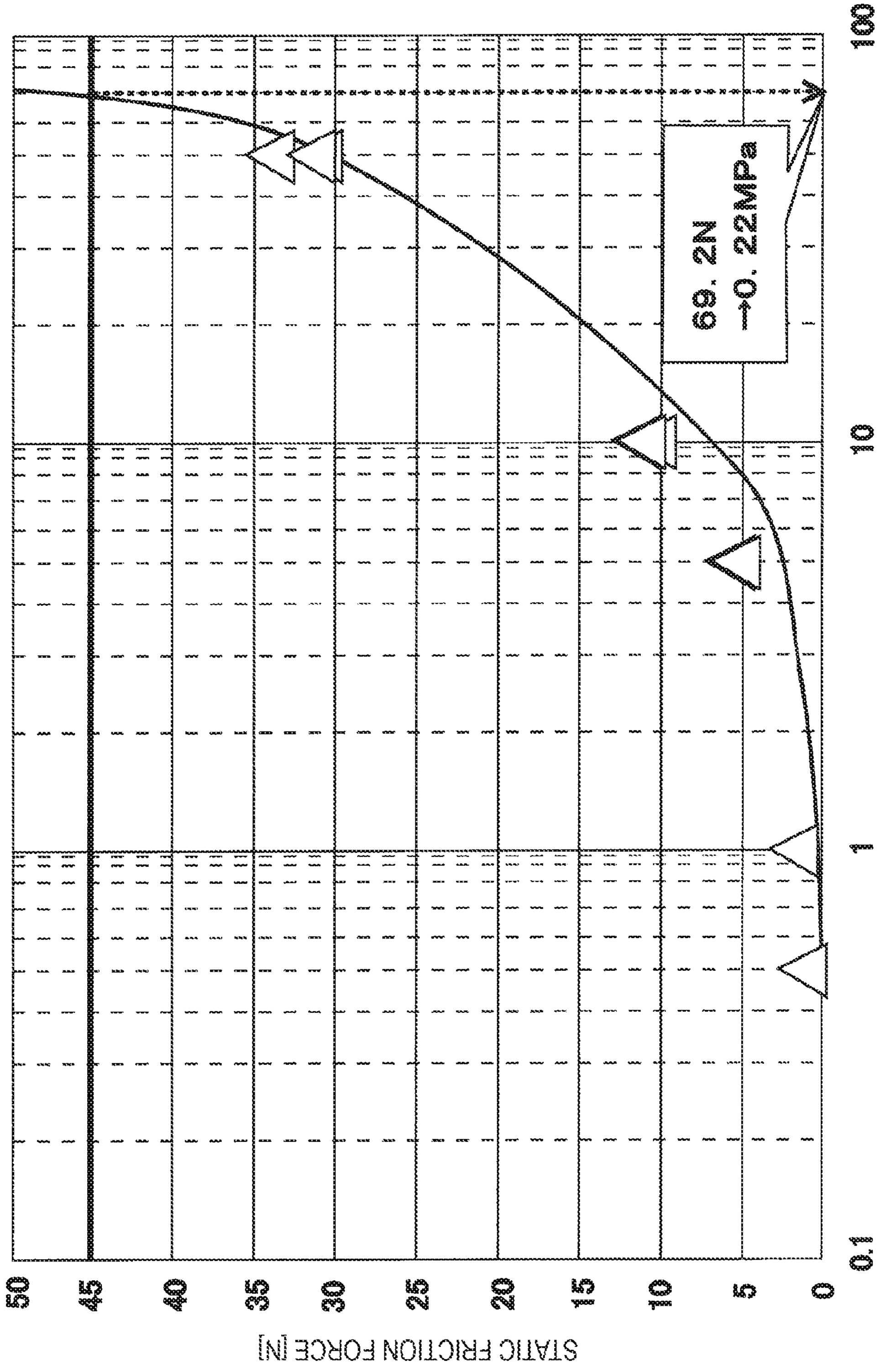
FIG. 7 is a graph showing a static friction force in the case where both the compression materials shown in FIG. 4 are made of EPDM rubber (the coefficient of static friction is 0.65).

FIG. 7 is a graph showing a static friction force in the case where both the compression materials 111, 121 shown in FIG. 4 are made of EPDM rubber (the coefficient of static friction is 0.65). As shown in FIG. 7, in the cases where compression forces of 0.5 N, 1 N, 5 N, 10 N, and 50 N were applied to the first compression member 110, the static friction forces were about 0.5 N, about 1.5 N, about 5 N, about 12 N, and about 33 N, respectively. It was confirmed that the static friction force can be approximated by a relational expression (the solid line in FIG. 7) of the friction force and the normal reaction force while the static friction coefficient (=0.65) between the plated fiber bundle S and EPDM rubber is set as the proportional constant.

As described with reference to FIG. 3, when the load F is 45 N which is the maximum value $F_{max}$ for realizing a bending resistance of 5 million times or more, therefore, the compression force is 69.2 N, and the pressure is 0.22 MPa.

In the shielded wire 1 in which the same shield braid 20 as in the example of FIG. 3 is employed, and EPDM rubber is used in both the covering portion 10*b* of the electrical wire 10, and the sheath 30, when the sheath internal pressure exceeds 0.22 MPa, a bending resistance of 5 million times or more cannot be realized.

When an internal pressure p is applied to a cylinder (the Young's modulus is E) in which the radius is R (=D1/2), and the thickness is t, the radius increase ΔR (=(D1−D2)/2) is given by the following expression:

$$\Delta R = \frac{R^2}{tE}p \tag{2}$$

Based on Expression (2) above and the maximum allowable value of the sheath internal pressure which has been described with reference to FIGS. 5 to 7, in the sheath 30 functioning as a stand-alone tube, the inner diameter D2 which does not lower the bending resistance of the shield braid 20 can be derived.

The above is summarized in that the allowable inner diameter $D2_{max}$ of the sheath 30 functioning as a stand-alone tube can be expressed by following Expression (3):

$$\frac{D1 - D2_{max}}{D1^2} = \frac{10^4 \cdot F_{max}}{\pi t E(\mu_A + \mu_B)} \tag{3}$$

Since, in addition to Expression (3) above, the sheath 30 is disposed on the shield braid 20, D2≥D1 never occurs, because, if D2≥D1 occurs, a clearance exists between the shield braid 20 and the sheath 30, and this causes the sheath 30 to wrinkle or crack. Therefore, Relational expression (1) above indicating the range of D2 is derived.

Figure 8:
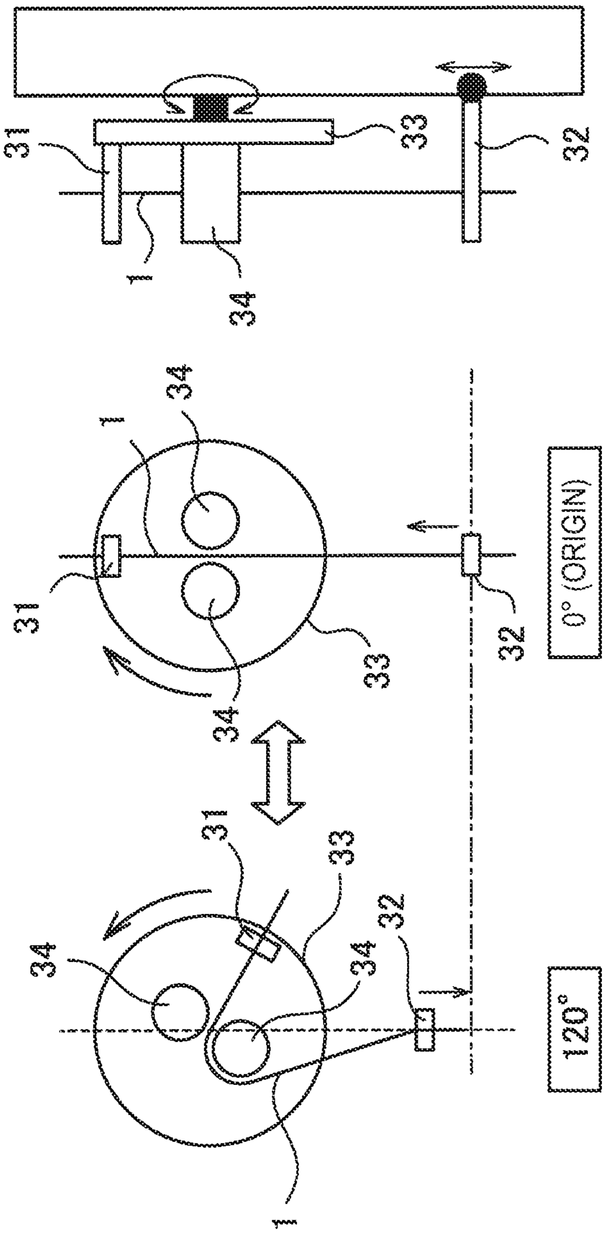
FIG. 8 is a diagram showing a bending test apparatus for a shielded wire.

Next, an example and a comparative example will be described. Table 1 below shows shielded wires of the example and the comparative example, and results of 5 million-cycle fatigue tests. In the fatigue tests of Table 1, a bending test apparatus shown in FIG. 8 was used, a 30 mm-radius bending in an angle range of 0° to 120° was repeatedly performed 5 million times at normal temperature, on the shielded wires 1 of the example and the comparative example, and it was checked whether plated fibers constituting the respective shield braids are broken or not. In the test, each of the shielded wires 1 was held by an upper clamp 31 and a lower clamp 32, and bent by rotation of a surface table 33. The lower clamp 32 is vertically movable. Bending at a bending radius corresponding to the radius of a mandrel 34 was repeatedly applied to the wire by rotations (forward and reverse rotations) of the surface table 33. The bending rate was 1.5 times/s. In Table 1, a case where breakage of the plated fibers of the shield braid 20 was not observed is indicated by "Good," and a case where plated fibers were broken is indicated by "Bad."

is 11 mm, and therefore smaller than 12.3 mm which is $D2_{max}$. Consequently, the sheath internal pressure is excessively raised, and the degree of freedom of the shield braid in the case where the shield braid is bent is lowered by the contractile force of the sheath, thereby increasing the possibility of wire breakage. As a result, a shielded wire which does not have a bending resistance of 5 million times is obtained.

In the shielded wire 1 of the embodiment, as described above, the inner diameter D2 of the sheath 30 in the free state satisfies Relational expression (1) above, and therefore the possibility that the constriction of the shield braid 20 is excessively increased by contraction of the sheath 30, and plated wires are broken before 5 million endurance cycles can be reduced. Therefore, the bending resistance of the whole shielded wire 1 can be improved.

When the wire harness WH includes the shielded wire 1 having the improved bending resistance, moreover, also the bending resistance of the whole wire harness can be improved.

Although the invention has been described with reference to the embodiment, the invention is not limited to the embodiment. Changes may be made to the embodiment without departing from the spirit of the invention, or the embodiment may be combined with other techniques (including well-known and known techniques).

TABLE 1

| | Wire cover | $\mu_A$ | Sheath | E [MPa] | $\mu_B$ | t [mm] | D1 [mm] | $F_{max}$ [N] | $D2_{max}$ [mm] | Actual size of D2 [mm] | Shield endurance (5 million times) |
|---|---|---|---|---|---|---|---|---|---|---|---|
| Example | Poly-ethylene | 0.4 | Poly-ethylene | 40 | 0.4 | 1 | 13.1 | 45 | 12.3 | 12.8 | Good |
| Comparative Example | Poly-ethylene | 0.4 | EPDM rubber | 10 | 0.65 | 2.8 | 13.1 | 45 | 12.3 | 11 | Bad |

In the shielded wire of the example, polyehylene was used in the covering portion of the wire, and the sheath. The coefficient ($\mu_A$, $\mu_B$) of static friction of polyehylene is 0.4, and the modulus of elasticity E of the sheath is 40 MPa. The thickness t of the sheath is 1 mm, and the inner diameter D1 of the sheath which covers the shield braid is 13.1 mm. The shield braid is identical with that of the embodiment shown in FIG. 3, $F_{max}$ is 45 N, and therefore $D2_{max}$ is 12.3 mm.

In the shielded wire of the comparative example, polyehylene was used in the covering portion of the wire, and EPDM rubber was used in the sheath. The coefficient ($\mu_A$) of static friction of polyehylene is 0.4, the coefficient ($\mu_B$) of static friction of EPDM rubber is 0.65, and the modulus of elasticity E of the sheath is 10 MPa. The thickness t of the sheath is 2.8 mm, and the inner diameter D1 of the sheath which covers the sheath braid is 13.1 mm. The shield braid is identical with that of the embodiment shown in FIG. 3, $F_{max}$ is 45 N, and therefore $D2_{max}$ is 12.3 mm.

In the shielded wire of the example, the inner diameter D2 of the sheath in the free state is 12.8 mm, and therefore larger than 12.3 mm which is $D2_{max}$. Consequently, the sheath internal pressure is not excessively raised, and the possibility of wire breakage can be reduced without causing the degree of freedom of the shield braid in the case where the shield braid is bent, to be lowered by the contractile force of the sheath. As a result, it is possible to obtain a shielded wire having a bending resistance of 5 million times.

Figure 9:
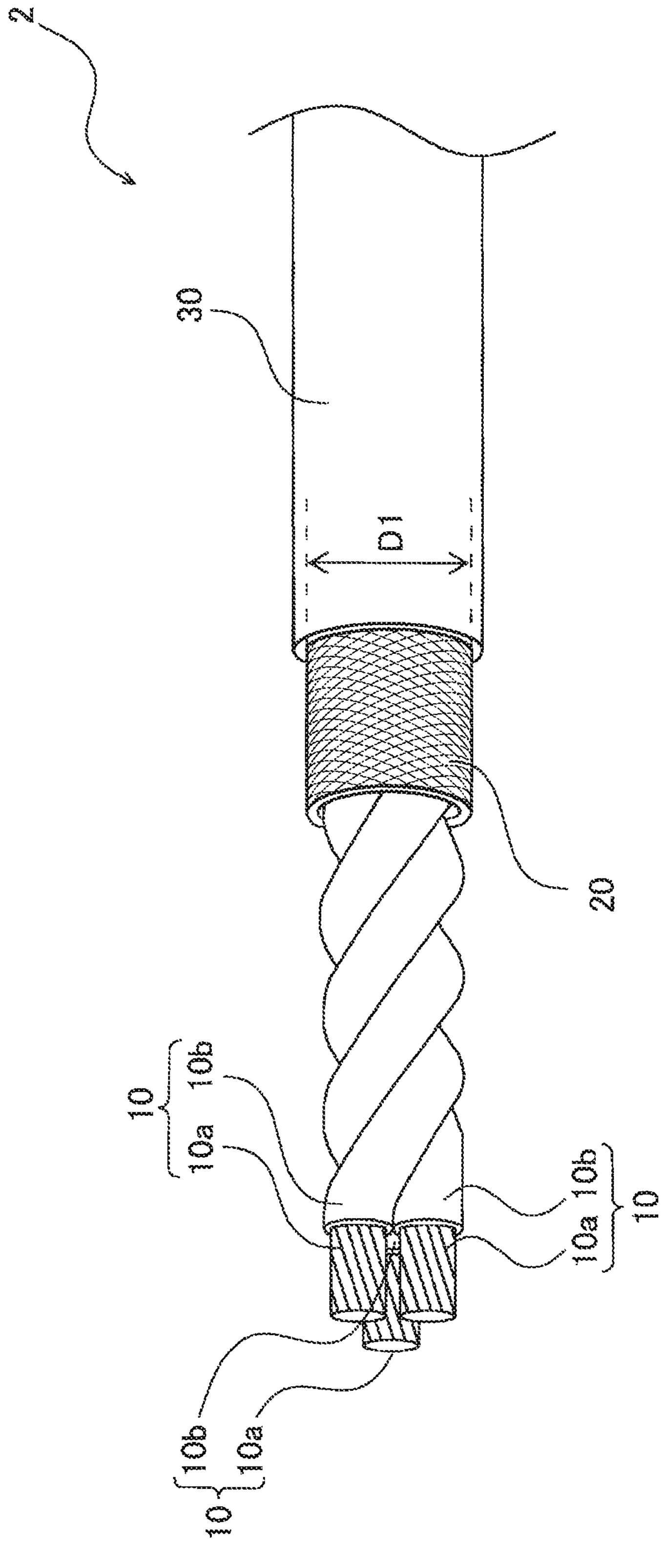
FIG. 9 is a perspective view showing a modification of the shielded wire.

In the shielded wire of the comparative example, by contrast, the inner diameter D2 of the sheath in the free state FIG. 9 is a perspective view showing a modification of the shielded wire 1. The number of the electrical wire 10 is not limited to one, and, as shown in FIG. 9, may be, for example, three (a plural number). Similarly with the electrical wire shown in FIG. 2, each of the three electrical wires 10 is configured by the conductor portion 10*a* and the covering portion 10*b*, and twisted. Since the shielded wire 1 includes the three electrical wires 10, the shielded wire can suitably function as an electrical wire for supplying a motor driving power to a three-phase drive motor which is attached to, for example, a wheel to rotate the wheel. Similarly with the conductor portion of the above-described electrical wire, the nominal sectional area of the conductor portion 10*a* is 8 sq. mm or more, or that is the conductor portion has a thickness which is suitable for supplying an electric power to a three-phase drive motor through an inverter.

In the case of such a twisted wire in which a plurality of electrical wires 10 are twisted, the inner diameter D1 of the sheath 30 disposed on the shield braid 20 is equal to a value which is obtained by adding the thickness of the shield braid to the twist diameter of the twisted wire.

Although the number of the electrical wires 10 shown in FIG. 9 is 3 the number is not limited to this, and the shielded wire may have 2 or 4 or more electrical wires. In FIG. 9, the configuration where the inverter is disposed on the vehicle body side is assumed, and therefore the shielded wire 1 includes the three electrical wires 10. In the case where an inverter is disposed on the wheel side, the number of electrical wires may be 2.

DESCRIPTION OF REFERENCE NUMERALS AND SIGNS

1: shielded wire
10: electrical wire
10*a*: conductor portion
10*b*: covering portion
20: shield braid
30: sheath

What is claimed is:

1. A shielded wire comprising:

an electrical wire including a conductor portion and a covering portion;

a shield braid in which electrically conductive wire members are braided, and which covers an outer circumference of the electrical wire; and a tubular sheath disposed on an outer circumference of the shield braid and made of an insulating resin, wherein D1 is an inner diameter of the sheath in a state where the sheath is disposed on the outer circumference of the shield braid, wherein t is a thickness of the sheath in the state where the sheath is disposed on the outer circumference of the shield braid, wherein E is a modulus of elasticity of the sheath, wherein $\mu_A$ is a coefficient of static friction between the shield braid and the electrical wire, wherein $\mu_B$ is a coefficient of static friction between the shield braid and the sheath, wherein $F_{max}$ is a value of a load which, in a fatigue test where a load is repeatedly applied to the shield braid in an axial direction of the braid, is obtained when an electrical resistance value of the shield braid is increased by 10% with respect to an initial value at a timing when the load is repeatedly applied 5 million times, wherein D2 is an inner diameter of the sheath in a free state, and wherein D2 satisfies following relational expression (1)

$$D1 - \frac{D1^2 F_{max} \times 10^4}{\pi t E(\mu_A + \mu_B)} \leqq D2 < D1. \tag{1}$$

2. A wire harness comprising the shielded wire according to claim 1.

* * * * *